United States Patent [19]
Pruniaux

[11] 3,761,785
[45] Sept. 25, 1973

[54] METHODS FOR MAKING TRANSISTOR STRUCTURES

[75] Inventor: Bernard Roger Pruniaux, New Providence, N.J.

[73] Assignee: Bell Telephone Laboratories, Incorporated, Murray Hill, N.J.

[22] Filed: Apr. 23, 1971

[21] Appl. No.: 136,851

[52] U.S. Cl. ............... 317/235, 317/235 B, 29/578, 29/580
[51] Int. Cl. ............................................ H01l 11/00
[58] Field of Search ...................... 29/571, 580, 578, 29/579; 317/235 AK

[56] References Cited

UNITED STATES PATENTS

| | | | |
|---|---|---|---|
| 3,244,555 | 4/1966 | Adam et al. | 29/580 |
| 3,506,502 | 4/1970 | Nakamura | 148/174 |

*Primary Examiner*—Charles W. Lanham
*Assistant Examiner*—W. Tupman
*Attorney*—W. L. Keefauver and Arthur J. Torsiglieri

[57] ABSTRACT

A high frequency field effect transistor is made by first epitaxially growing semiconductor channel and drain layers over a source layer. An oxide layer is formed on the upper drain layer which acts as a mask during etching of the epitaxial layers. Anisotropic etching of the semiconductor forms a mesa configuration of the channel and drain layers which is overlapped by the upper oxide layer. Metal is then evaporated onto the mesa from a point opposite the oxide layer. The overhanging oxide layer masks part of the mesa, particularly the drain layer, to define precisely the area covered by the evaporated gate contact, as required for high frequency operation. Other embodiments are also described.

13 Claims, 10 Drawing Figures

INVENTOR
B.R.PRUNIAUX
BY
Roderick B. Anderson
ATTORNEY

METHODS FOR MAKING TRANSISTOR STRUCTURES

BACKGROUND OF THE INVENTION

This invention relates to methods for making semiconductor devices, and more particularly, to methods for making microwave frequency field effect transistors.

Field effect transistors conventionally comprise source and drain regions formed on an upper surface of a wafer and interconnected by a channel region. A gate electrode overlying the channel region controls current flow through the channel, thereby to perform such useful functions as amplification and switching. Because current conduction is by carriers of a single polarity, field effect transistors are often known as unipolar devices to distinguish them from conventional transistors, known as bipolar devices. They are also often known by the abbreviated term FET, and if the gate electrode is insulated from the channel layer, they are known as IGFET devices (for Insulated Gate Field Effect Transistor).

As the frequency of operation of field effect transistors is increased, the size of device components, and particularly the channel length, must be reduced. The various component parts of the device are normally defined by photolithographic exposure of a photosensitive film through appropriate masks. These techniques do not permit the formation of as short a channel as would be desired, nor do they permit the formation of a gate electrode over the channel with the desired accuracy. For insulated gate (IGFET) devices used at microwave frequencies, the gate electrode may overlap the source region slightly to maximize transconductance, should be long enough to maximize amplification, but, to avoid deleterious gate-to-drain feedback capacitance, should not overlap the drain region.

To satisfy these requirements and to give satisfactory dependable operation at microwave frequencies, it would be desirable to fabricate IGFET devices with channels of less than a micron to a few microns in length, with automatic registration of the gate electrode between the source and the drain regions, and with control of gate electrode length and spacings to accuracies of substantially less than 1 micron.

These requirements cannot be met with any reasonable degree of reproducibility with present photolithographic fabrication techniques.

SUMMARY OF THE INVENTION

The Abstract of the Disclosure briefly describes a method for making a field effect transistor in accordance with one embodiment of the invention. Notice that the channel length, that is, the distance between the source and drain regions, is defined by the thickness of an epitaxially grown layer. As is known, this thickness can be made very small; significantly, it can be made much smaller than a conventionally defined channel along the surface of a wafer.

The gate electrode length and spacing is controlled by the oxide overhang on the top of the mesa structure. Notice that the oxide overhang essentially constitutes a mask which is automatically registered with the rest of the structure. Registration accuracy is assured because the extent of etch undercutting is predictable to a high degree of accuracy. As will be explained later, this technique is preferably used with silicon semiconductors in which a predetermined orientation of the crystallographic planes assures etch undercutting at an accurately predictable angle.

In a preferred embodiment, an oxide layer is formed on the sides of the mesa prior to evaporation of the gate electrode, thereby to yield a microwave IGFET structure. As will be explained later, the oxide overhang is preferably designed such that the gate electrode overlaps the source region but does not overlap the drain region. In other embodiments, an etched overhang can be made by forming two layers of oxide and partially selectively etching the lower layer to leave an upper layer overhang, which may be used for a number of purposes.

These and other objects, features, and advantages of the invention will be better understood from a consideration of the following detailed description taken in conjunction with the accompanying drawing.

DRAWING DESCRIPTION

DETAILED DESCRIPTION

Figure 1:
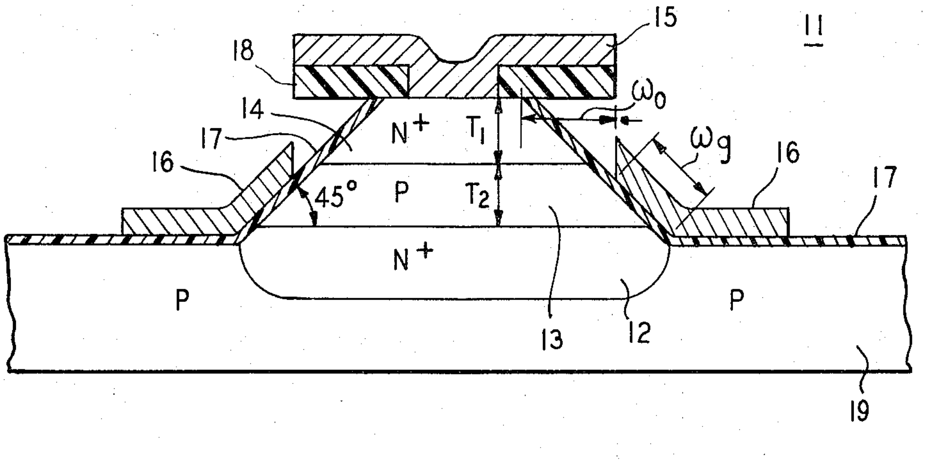
FIG. 1 is a schematic view of an IGFET device illustrating the principles of one embodiment of the invention.

Referring now to FIG. 1 there is shown a cross-sectional view of a field effect transistor 11, made in accordance with an illustrative embodiment of the invention, comprising a source region 12, channel region 13, and drain region 14. The electrical contact to the drain is made by a drain electrode 15 and a similar electrode contacts source region 12. A gate electrode 16 partially surrounds channel region 13 and is insulated from it by an insulative film 17.

During operation, a positive voltage is applied to the gate electrode 16 to invert the conductivity of part of the channel region 13 thereby to permit electron conduction between the source and drain regions. Modulation of the gate voltage controls this conduction to permit such useful functions as amplification and switching. Because electronic conductivity inversion enhances conduction between the source and drain regions, this form of operation is known as the "enhancement mode," also sometimes known as the "inversion mode." Complementary conductivity could alternatively be used; that is, the source, gate, and drain regions could respectively be of $p^+$, $n$, and $p^+$ conductivities.

An important feature of the FIG. 1 device is that the channel region 13 has been formed as a layer; the channel length is determined by the thickness of the layer in the vertical direction, rather than being defined along a horizontal semiconductor surface as is normally the case. This thickness can be made very small and reproduced with accuracy using standard epitaxial processes, as will be described later. The structure of FIG.

1 has the appearance of a "mesa," which, as is known, results from anisotropic etching along crystallographic planes. An oxide mask is used during the etch, and the undercutting of the semiconductor provides an overhang 18 of the oxide layer which constitutes a self-aligning mask for controlling the deposition by evaporation of gate electrode 16. Notice that the gate electrode 16 partially overlaps the source region 12 but does not overlap the drain region 14, as required for optimum microwave operation. The area covered by the gate electrode 16 is determined by the extent of overhang of oxide layer 18, which can be controlled with a high degree of accuracy as will become clear later.

The $p$-type wafer 19 in which source region 12 is formed serves no active electrical function, and as such, the bottom portion of it may be removed, as by polishing or etching, to permit electrical contact to the source region 12. Alternatively, contact may be made in a plane of the device other than that shown in the figure, or the source region may be extended asymmetrically to one side for contact purposes as illustrated in FIG. 2E.

Figure 2A:
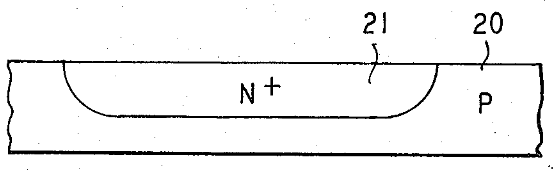
FIGS. 2A through 2E illustrate successive steps in making an IGFET transistor in accordance with an illustrative embodiment of the invention.
Figure 2B:
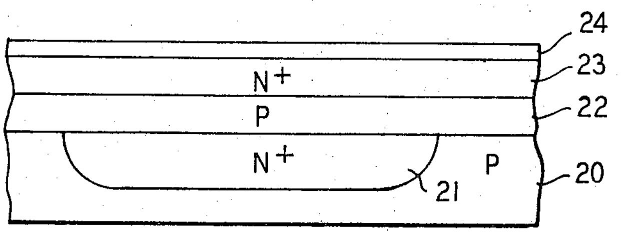
Figure 2C:
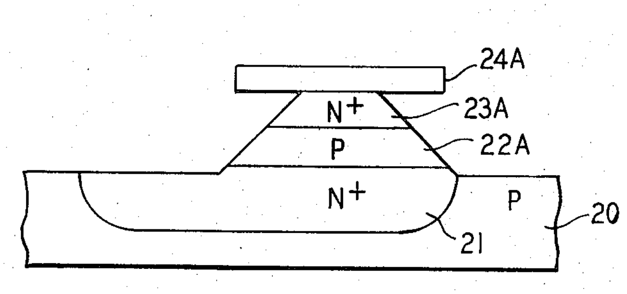
Figure 2D:
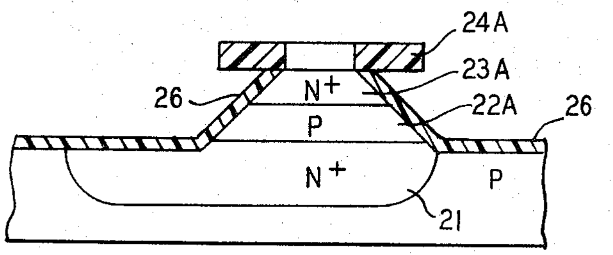
Figure 2E:
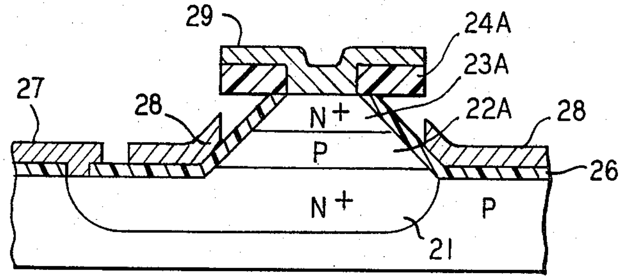

Referring to FIGS. 2A through 2E, the invention is preferably practiced by first diffusing $n^+$ impurities into a $p$-type wafer 20 to form the source region 21. A $p$-type channel layer 22 and an $n^+$-type drain layer 23 are then epitaxially grown over the source region 21 as shown in FIG. 2B. As is known, epitaxial growth refers to the formation of semiconductor layers such that they constitute an extension of the crystal lattice structure of a substrate. The semiconductor conductivity can conveniently be accurately controlled during epitaxial growth, and the layer thickness can advantageously be made very small to within close tolerances. Next, an insulative layer 24 is formed over drain layer 23. The semiconductor material is preferably silicon upon which an insulative layer 24 of silicon dioxide can be formed with dependability as is conventional in the art.

Referring to FIG. 2C, the insulative layer 24 is etched to form a mask layer 24A. The channel and drain layers are then etched, using layer 24A as a mask, to yield channel region 22A and drain region 23A. The etched semiconductor forms a mesa configuration due to anisotropic etching with undercutting of the mask 24A. As depicted, there is also some etching of wafer 20 and source region 21, although this effect is minor.

If the wafer is of silicon, the upper plane of the wafer preferably lies along the (100) crystallographic plane, in which case the upper surfaces of epitaxial layers 22 and 23 necessarily lie along that same plane. Then, by known principles of anisotropic etching, the epitaxial layers must be etched such that their sides slope either at 45° or at 57.3°. The layers are preferably etched along the (110) crystallographic plane, in which case the mesa will necessarily have sides that slope at 45°. Thus, the extent to which mask layer 24A overhangs the mesa structure is easily and accurately predictable. The sample is thereafter oxidized to form an insulative layer 26 over the entire exposed upper surface, in which electrode openings to the source and drain regions are formed.

Referring to FIG. 2E, the sample is next metallized by evaporation. The overhanging portion of the mask layer 24A shields or shadow masks the upper portion of the mesa structure from the metal vapor. Metal deposited on the upper surface of the wafer is etched to define a source electrode 27 and a gate electrode 28, while metal deposited on the top of the mesa constitutes the drain electrode 29.

In accordance with the invention, the masking by layer 24A accurately and precisely limits the area covered by gate electrode 28 and prevents it from overlapping the drain region 23A, while overlapping the extremely short channel region.

Figure 3:
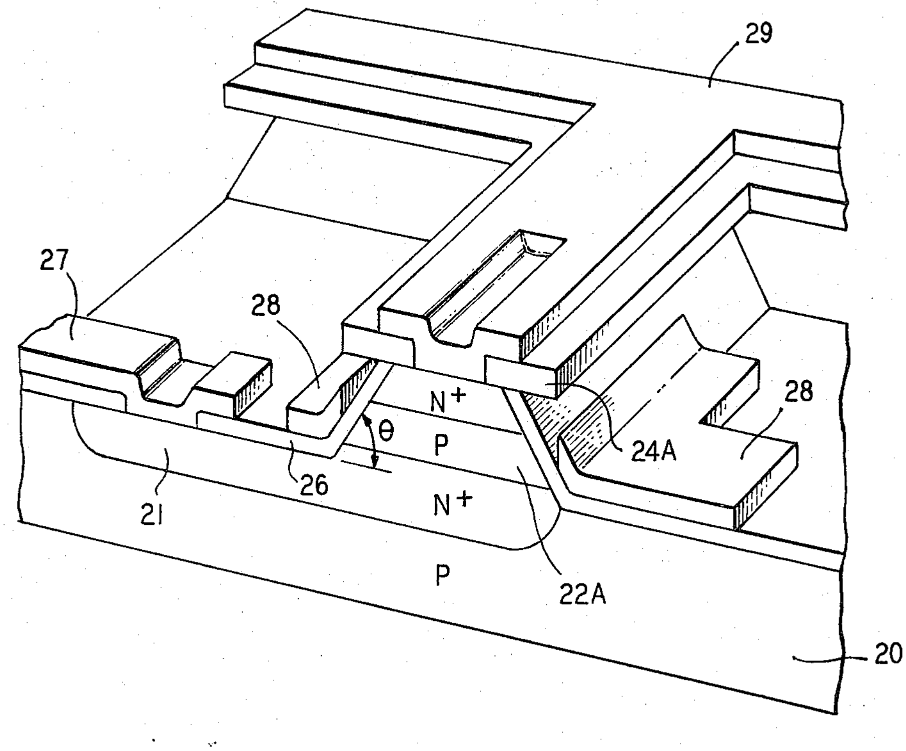
FIG. 3 is a schematic perspective view of an IGFET transistor made in accordance with an illustrative embodiment of the invention.

A schematic partially cut away perspective view of the finished device of FIG. 2E is shown in FIG. 3. The substrate 20 may be of silicon with a typical $p$-type conductivity of 1 to 2 ohm-centimeters, with the upper surface being along the (100) plane as mentioned before. The source and drain layers may be $n$-type with a typical resistivity of $10^{-2}$ ohm-centimeters. The thickness of channel layer 22A, and thus the length of the IGFET channel may be on the order of 0.3 micron which is a much shorter channel than can dependably be made by present conventional techniques. It is believed that channel lengths on the order of 1,000 angstroms can routinely be made using known silicon epitaxial and other silicon integrated circuit technology.

The width of the mask layer 24A may be 50 microns, and the length of the drain electrode may be 500 microns. Insulative layers 24A and 26 are preferably grown silicon dioxide with respective thicknesses of 2,000 angstroms and 1,000 angstroms. The source, gate, and drain electrodes formed by metal evaporation may have a thickness of 3,000 to 5,000 angstroms. The air isolation between the gate and source electrodes may be made with conventional mask and etch techniques with a separation between the two electrodes of as little as 0.5 micron.

As mentioned before, the etch angle $\theta$ shown in FIG. 3 is readily and accurately predictable. Since the gate electrode 28 must overlap the channel layer, but must not overlap the drain layer, trigonometric considerations give the following limits for the length of overhang $W_o$ of the mask layer 24A:

$$T_1 + T_2/\tan\theta > W_o > T_1/\tan\theta$$

where $T_1$ and $T_2$ are respectively the thicknesses of layers 23A and 22A. The mask layer 24A is preferably oriented to give an etch along the (110) plane resulting in an angle $\theta$ of 45°.

Figure 4A:
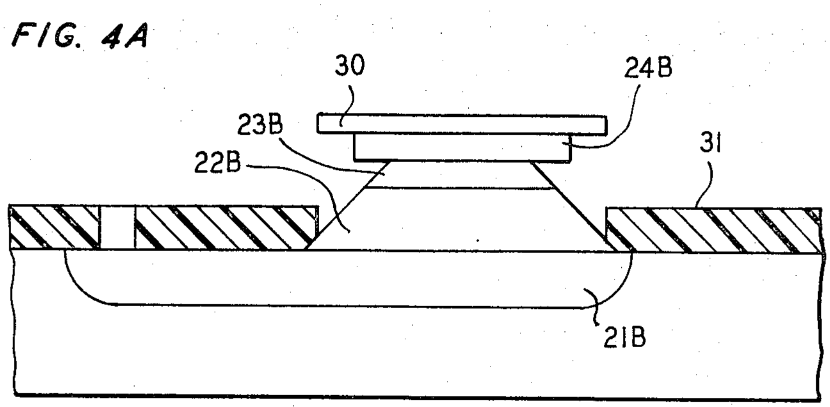
FIGS. 4A and 4B illustrate successive steps in making a field effect transistor in accordance with another illustrative embodiment of the invention.

One problem with the contacting technique of FIG. 2E is that the source-to-gate capacitance may be larger than would be desired. It may therefore be desirable to increase the thickness of the insulator between the gate electrode and the source region 21 without increasing the separation of the gate electrode from the channel region 22A. Alternatively, it may be desired to insulate the gate electrode from the source region while allowing it to make a direct Schottky barrier contact with the channel region. Referring to FIG. 4A, a mesa is formed of channel and drain layers 22B and 23B by anisotropic etching with undercutting of a silicon dioxide mask layer 24B. However, a silicon nitride ($Si_3N_4$) layer 30 overhangs the silicon dioxide layer 24B. The overhang can conveniently be made by forming the layer 30 to be coextensive with layer 24B, and then exposing the sample to an etchant which selectively etches silicon dioxide. The etchant will dissolve the silicon dioxide as a function of time, and after a predetermined time, the etchant may be removed, leaving the desired overhang of layer 30.

A silicon dioxide layer 31 is then formed by evaporation deposition, rather than by chemical reaction. The mask 30, of course, shields the mesa from the silicon dioxide evaporant, thus giving an insulative covering only over the wafer and source region 21B.

Figure 4B:
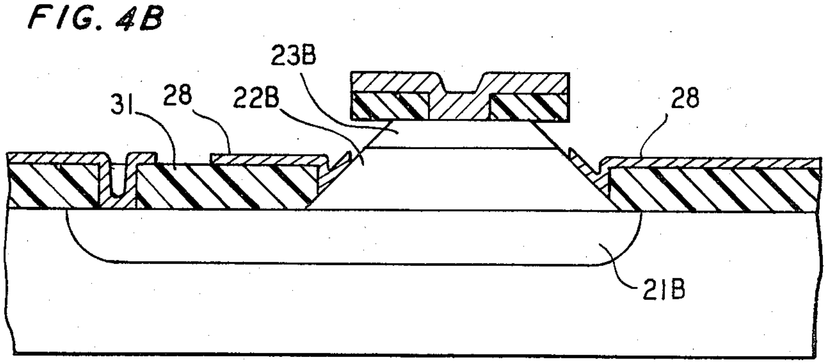

Referring to FIG. 4B, silicon nitride layer 30 is then dissolved by a selective etch, leaving only the silicon dioxide mask layer 24B overhanging the mesa. The metal gate electrode 28 is deposited by evaporation as before and is masked by layer 24B so as not to contact the drain region 23B. The device shown is a Schottky barrier field effect transistor; that is, gate electrode 28 forms a Schottky barrier with channel region 22B. The technique, however, works equally well with IGFET devices, in which case, as before, a thin layer of silicon dioxide is grown on the sides of the mesa prior to deposition of the metal electrodes. In either case, the gate-to-source capacitance is decreased by the relatively large thickness of the deposited oxide layer 31.

It is apparent that if the contact 28 forms a non-rectifying or ohmic contact to layer 22, and if other parameters are appropriately controlled, the finished device may constitute a bipolar transistor. As is known, formation of an ohmic contact generally requires a high conductivity semiconductor, in this case, layer 22.

The selective etching of silicon oxide and silicon nitride can be used as a substitute for undercutting in forming the overhang that shadow masks the mesa during deposition of the gate electrode. This may be important because, in some situations, anisotropic etching of a mesa configuration does not undercut the oxide mask. In silicon, for example, if the mask stripe is oriented to give anisotropic etching along the (111) plane, rather than the (110) plane, it is well known that there will be no appreciable undercutting.

Figure 5:
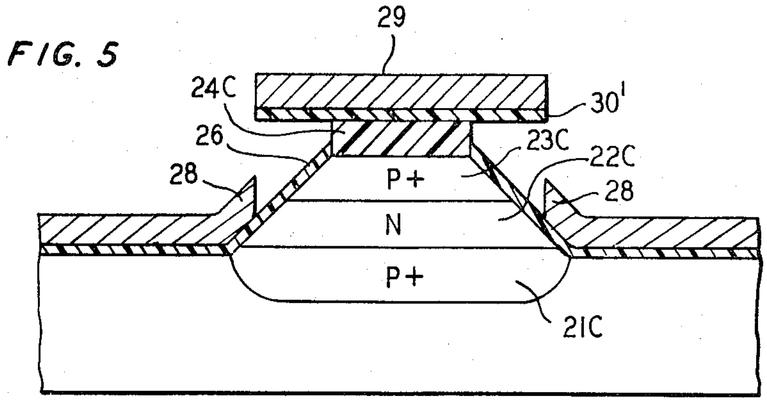
FIG. 5 is a schematic view of an IGFET device illustrating still another embodiment of the invention.

Referring to FIG. 5, a silicon nitride mask layer 30' overhangs a silicon dioxide mask layer 24C. The layers 24C and 30' are formed in the same manner as described with reference to FIG. 4, with the same selective etch of layer 24C used to form the overhang. The silicon dioxide mask 24C is oriented in a known manner so that etching of the silicon epitaxial layers 22C and 23C is along the (111) plane, which results in substantially no undercutting of the mask 24C. The silicon nitride mask 30' is then used to mask the evaporation of metal film on the mesa structure as shown. The dimensions of mask 30' therefore determine the extent of gate electrode 28 with substantially the same self-aligning precision as the masking technique of FIG. 2.

The FIG. 5 device is shown illustratively as including an insulative oxide film 26 which, of course, is formed prior to evaporation of the metal film 28, and results in an IGFET structure. The conductivities of the various semiconductor regions are shown as being complementary to those of FIGS. 1 and 2, again for illustrative reasons. It is intended that the drain contact 29 makes contact with the drain region 23C in a plane of the device other than that shown in the figure.

In summary, techniques have been shown for making, with more precision than has heretofore been possible, field effect transistor structures having extremely small channel lengths. These devices can be used at higher microwave frequencies with high efficiencies than presently available IGFETs or FETs and therefore constitute a significant improvement.

Several embodiments and modifications have been referred to as being alternative constructions to those specifically described. Various other embodiments and modifications may be made by those skilled in the art without departing from the spirit and scope of the invention. For example, ion implantation may be used for forming the various semiconductor layers as is known. Various semiconductors such as gallium arsenide may be used in forming the device.

What is claimed is:

1. A method for making transistor devices comprising the steps of:

forming on a semiconductor wafer successive first, second and third layers, at least one layer having a different conductivity type from that of another layer;

forming a smaller area oxide mask on the surface of the third layer;

selectively etching the semiconductor layers to form a mesa structure that is overlapped by the oxide mask layer;

forming an insulative layer on the etched surfaces of the first, second and third layers;

and evaporating metal onto the mesa structure, including at least part of the insulative layer overlying the second layer, from a point opposite the oxide mask layer such that the mask layer shadow masks the third layer from the vaporized metal.

2. The method of claim 1 wherein:

the step of etching the second and third layers comprises the step of anisotropic etching the said layers to form the mesa configuration.

3. The method of claim 2 wherein:

the semiconductor is silicon, the upper surface of the wafer is oriented along the (100) crystallographic plane and the mask layer is oriented to give anisotropic etching along the (110) plane, whereby the etching undercuts the mask layer to form the overhang and the mesa sides taper at a 45 degree angle.

4. The method of claim 2 wherein:

the mask layer overhangs the junction between the second and third layers, but does not overhang the junction between the first and second layers, whereby at least part of said evaporated metal is deposited adjacent to the second layer.

5. The method of claim 4 further comprising the step of:

forming an insulative layer on the mesa surface prior to the metal evaporation step, whereby the finished structure may be operated as an IGFET device.

6. The method of claim 4 wherein:

the step of forming the mask layer comprises the steps of forming a first mask layer on the upper surface of the third layer, forming a second mask layer on the upper surface of the first mask layer, etching part of the first mask layer such that the second mask layer overhangs the first mask layer;

depositing the insulative material on the horizontal upper surface of the wafer from a location opposite the second mask layer such that the second mask layer shields the mesa surface from the deposited insulative material;

and selectively dissolving the second mask layer, thereby leaving the first mask layer which overhangs part of the mesa surface.

7. The method of claim 4 wherein:

the second and third layers constitute channel and drain layers formed by epitaxial growth, thereby permitting extremely small active channel lengths.

8. A method for making IGFET devices comprising the steps of:

forming on a semiconductor wafer successive source, channel, and drain layers;

forming a smaller area oxide mask layer on the drain layer;

selectively etching the semiconductive layers to form a mesa structure that is overlapped by the oxide mask layer;

forming an insulative layer on the etched surface of the source, channel, and drain layers;

and evaporating metal onto the mesa structure, including at least part of the insulative layer overlying the channel layer, from a point opposite the oxide mask layer such that the mask layer shadow masks the drain layer from the vaporized metal.

9. The method of claim 8 wherein:

the step of forming the channel and drain layers comprises the step of epitaxially growing said channel and drain layers, thereby permitting an extremely small active channel length.

10. The method of claim 9 wherein the oxide mask layer overhangs the mesa structure by a distance $W_o$ that conforms to the relation $$T_1 + T_2/\tan\theta > W_o > T_1/\tan\theta$$

where $T_1$ is the thickness of the drain layer, $T_2$ is the thickness of the channel layer, and $\theta$ is the angle that the sides of the mesa forms with the wafer surface.

11. A method for making transistor devices comprising the steps of:

forming on a semiconductor wafer successive first, second and third layers, at least one layer having a different conductivity type from that of another layer;

forming a smaller area oxide mask layer on the surface of the third layer;

selectively etching the semiconductor layers by using said mask layer to form a mesa structure having tapered sidewalls extending from the surface of the third layer to said first layer, with part of the tapered sidewalls being defined by an etched surface of the second layer, and the remaining portion of the third layer being completely overlapped by the oxide mask layer;

forming an insulative layer on the exposed surface of the first layer, including that portion which is closely adjacent the second layer;

and evaporating metal onto the insulative layer, the mask layer and exposed portions of the tapered sidewalls of the second layer from a point opposite the oxide mask layer such that the mask layer masks the third layer completely from the vaporized metal.

12. A transistor made by the steps of:

forming on a semiconductor wafer successive first, second and third layers, at least one layer having a different conductivity type from that of another layer;

forming a smaller area oxide mask on the surface of the third layer;

selectively etching the semiconductor layers to form a mesa structure that is overlapped by the oxide mask layer;

forming an insulative layer on the etched surfaces of the first, second and third layers;

and evaporating metal onto the mesa structure, including at least part of the insulative layer overlying the second layer, from a point opposite the oxide mask layer such that the mask layer shadow masks the third layer from the vaporized metal.

13. A transistor made by the steps of:

forming on a semiconductor wafer successive first, second and third layers, at least one layer having a different conductivity type from that of another layer;

forming a smaller area oxide mask layer on the surface of the third layer;

selectively etching the semiconductor layers by using said mask layer to form a mesa structure having tapered sidewalls extending from the surface of the third layer to said first layer, with part of the tapered sidewalls being defined by an etched surface of the second layer, and the remaining portion of the third layer being completely overlapped by the oxide mask layer;

forming an insulative layer on the exposed surface of the first layer, including that portion which is closely adjacent the second layer;

and evaporating metal onto the insulative layer, the mask layer and exposed portions of the tapered sidewalls of the second layer from a point opposite the oxide mask layer such that the mask layer masks the third layer completely from the vaporized metal.

* * * * *